US008917749B2

(12) United States Patent
Lee

(10) Patent No.: US 8,917,749 B2
(45) Date of Patent: Dec. 23, 2014

(54) LASER DIODE MOUNTING SUBSTRATE FOR AUTOMOTIVE LAMP MODULE

(71) Applicant: Hyundai Mobis Co., Ltd., Seoul (KR)

(72) Inventor: Tae Won Lee, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 14/166,949

(22) Filed: Jan. 29, 2014

(65) Prior Publication Data

US 2014/0294025 A1 Oct. 2, 2014

(30) Foreign Application Priority Data

Mar. 27, 2013 (KR) ........................ 10-2013-0032502

(51) Int. Cl.
*H01S 3/04* (2006.01)
*H01S 5/024* (2006.01)
*F21S 8/10* (2006.01)

(52) U.S. Cl.
CPC ............. *H01S 5/02476* (2013.01); *F21S 48/00* (2013.01)
USPC ............................. 372/36; 372/34; 372/43.01

(58) Field of Classification Search
USPC .......................................... 372/36, 34, 43.01
See application file for complete search history.

(56) References Cited

U.S. PATENT DOCUMENTS

| | | | | |
|---|---|---|---|---|
| 2003/0142712 A1* | 7/2003 | Ikeda et al. | ..................... | 372/36 |
| 2013/0107901 A1* | 5/2013 | Deppe | ............................. | 372/36 |

* cited by examiner

*Primary Examiner* — Kinam Park
(74) *Attorney, Agent, or Firm* — NSIP Law

(57) ABSTRACT

Provided is a laser diode mounting substrate for an automotive lamp module using a laser diode. The substrate includes: a substrate body with a power supply circuit pattern, which electrically connects a connector with a contact point of the laser diode, on the top; a first heat conduction layer disposed at the area except for the power supply circuit pattern, on the top of the substrate body; and a second heat conduction layer disposed on the bottom of the substrate body, in which at least one heat transfer hole is disposed through the first heat conduction layer, the substrate body, and the second heat conduction layer. Therefore, the present invention provides an effect that heat generated by the laser diode can be effectively dissipated.

5 Claims, 5 Drawing Sheets

LASER DIODE MOUNTING SUBSTRATE FOR AUTOMOTIVE LAMP MODULE

CROSS-REFERENCE TO RELATED APPLICATIONS

This application claims priority to and the benefit of Korean Patent Application No. 10-2013-0032502 filed in the Korean Intellectual Property Office on Mar. 27, 2013, the entire contents of which are incorporated herein by reference.

TECHNICAL FIELD

The present invention relates to a laser diode mounting substrate, and more particularly, to a laser diode mounting substrate for an automotive lamp module using a laser diode.

BACKGROUND ART

LEDs (Light Emitting Diode) or light bulbs are generally used as the light sources of automotive lamps. Recently, there has been an effort to use laser diodes for the automotive light sources, but an efficient technology has not been proposed up to now.

Presently, laser diodes are generally used in the medical and industrial fields. The laser diode (LD), a general term of lightwave oscillators and amplifiers using stimulated emission of photons by optical transition of electrons in semiconductors, has two electrodes. The laser diodes have the advantages that they are small in size and light in various lasers and can be manufactured in large quantities at low costs through semiconductor processes.

However, the laser diodes that are under development now for automotive lamp modules have a problem in that they are difficult to use for vehicles, because the structures are complicated and the heat sinks for heat dissipation are large in size. In particular, the existing substrates mounted with laser diodes have configurations having difficulty in effective heat dissipation, because the other regions except for the circuit patterns are in insulation.

SUMMARY OF THE INVENTION

The present invention has been made in an effort to provide a laser diode mounting substrate that uses a laser diode, has a simple structure and a compact size, and can be used for an automotive lamp module.

The present invention provides a laser diode mounting substrate that can effectively dissipate heat generated by a laser diode.

An embodiment of the present invention provides a laser diode mounting substrate for an automotive lamp module using a laser diode, including: a substrate body with a power supply circuit pattern, which electrically connects a connector with a contact point of the laser diode, on the top; a first heat conduction layer disposed at the area except for the power supply circuit pattern, on the top of the substrate body; and a second heat conduction layer disposed on the bottom of the substrate body, in which at least one heat transfer hole is disposed through the first heat conduction layer, the substrate body, and the second heat conduction layer.

The contact point of the laser diode may be disposed at the center of the substrate body and the connector may be positioned at the center portion of any one of the longitudinal and transverse sides of the substrate body.

The heat transfer holes may be arranged at predetermined gaps in any one of the longitudinal and transverse directions.

The first heat conduction layer and the second heat conduction layer may be formed by plating the substrate with copper.

At least one fastening hole through which fastening members are inserted to fasten other parts may be disposed through the first heat conduction layer, the substrate body, and the second heat conduction layer.

According to embodiments of the present invention, it is possible to effectively dissipate heat generated by the laser diode by fastening the upper heat sink and the lower heat sink to the top and the bottom of the substrate. In particular, since the top and the bottom of the laser diode mounting substrate are plated with copper and the heat transfer holes are disposed through them, it is possible to more effectively dissipate heat by connecting the upper heat sink and the lower heat sink so that they can transmit heat, in addition to fixing the laser diode and supplying power.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
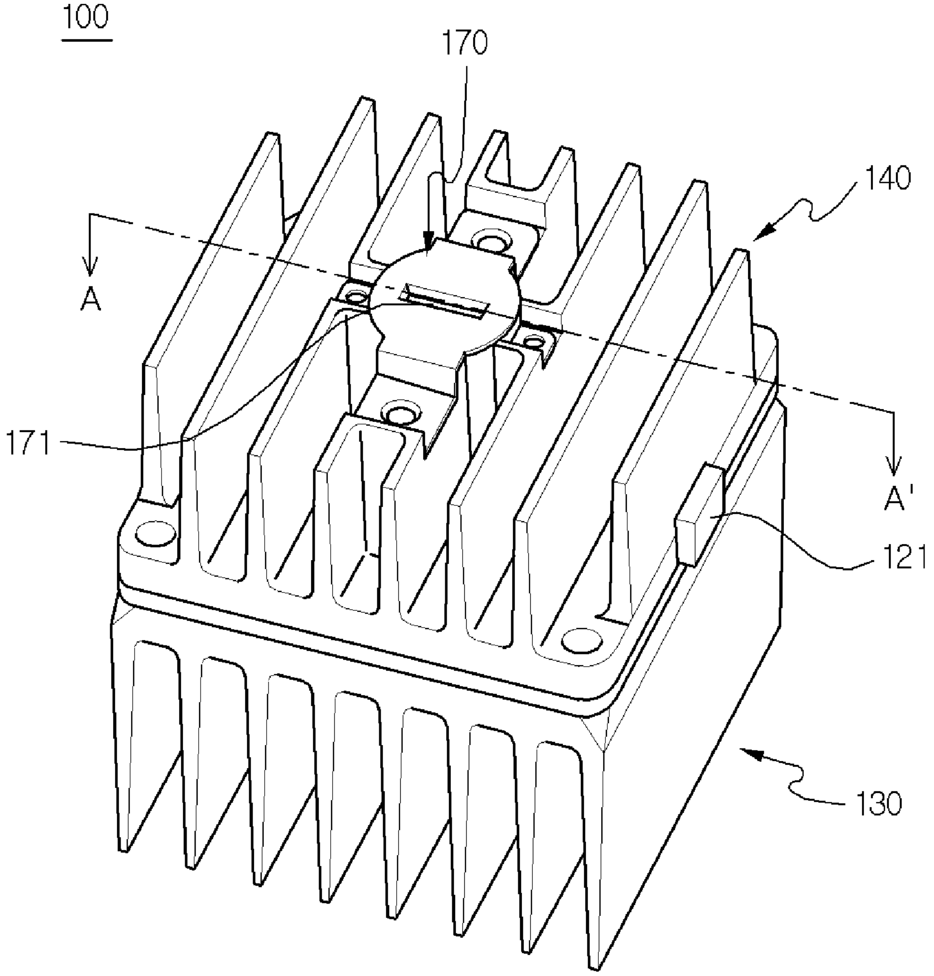
FIG. 1 is a view illustrating an automotive lamp module that is equipped with a laser diode mounting substrate according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, embodiments of the present invention will be described in detail with reference to the accompanying drawings. First, in the specification, in giving reference numerals to components throughout the drawings, it should be noted that like reference numerals designate like components even though the components are illustrated in different drawings. Although exemplary embodiments of the present invention will be described hereafter, the spirit of the present invention is not limited thereto and may be modified and implemented in various ways by those skilled in the art.

Figure 2:
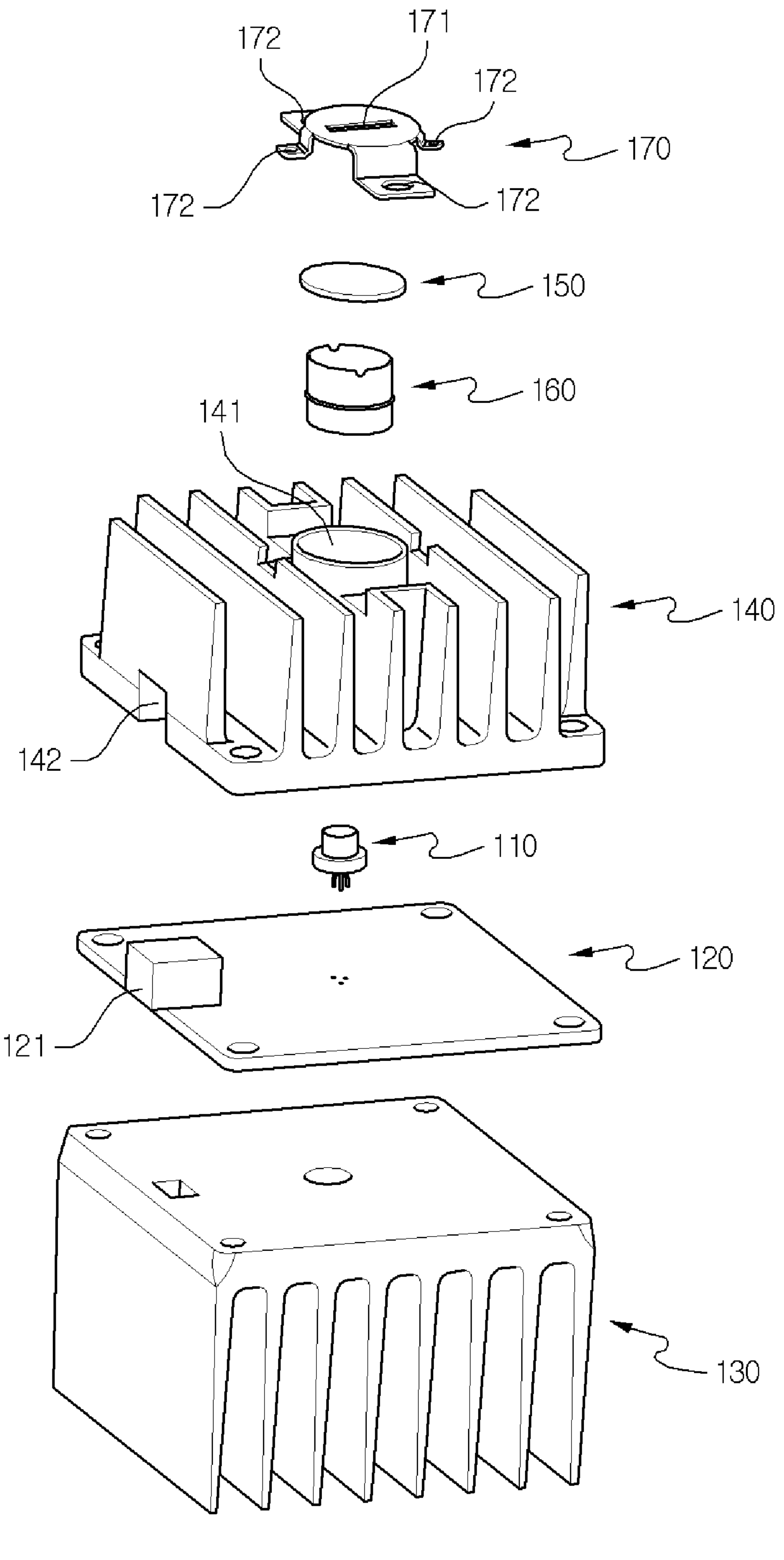
FIG. 2 is an exploded view of the automotive lamp module of FIG. 1.

FIG. 1 is a view illustrating an automotive lamp module that is equipped with a laser diode mounting substrate according to an embodiment of the present invention and FIG. 2 is an exploded view of the automotive lamp module of FIG. 1.

FIGS. 1 and 2 illustrates only main characteristic parts for conceptually clear understanding of the present invention, so various modifications are expected in the figures and the scope of the present invention is not limited to the specific shapes illustrated in the figures.

Referring to FIGS. 1 and 2, an automotive lamp module 100 that is equipped with a laser diode mounting substrate 120 according to an embodiment of the present invention may include a laser diode 110, a lower heat sink 130, an upper heat sink 140, a phosphor 150, a collimator 160, and a phosphor holder 170.

The laser diode 110 is mounted on the top of the laser diode mounting substrate 120. The lower heat sink 130 is coupled to the bottom of the laser diode mounting substrate 120 and the upper heat sink 140 is coupled to the top of the laser diode mounting substrate 120. The collimator 160, phosphor 150, and phosphor holder 170 may be disposed on the upper heat sink 140.

The laser diode mounting substrate 120 supplies power to the laser diode 110, and allows the upper heat sink 140 and the lower heat sink 130 to transmit heat.

Figure 3:
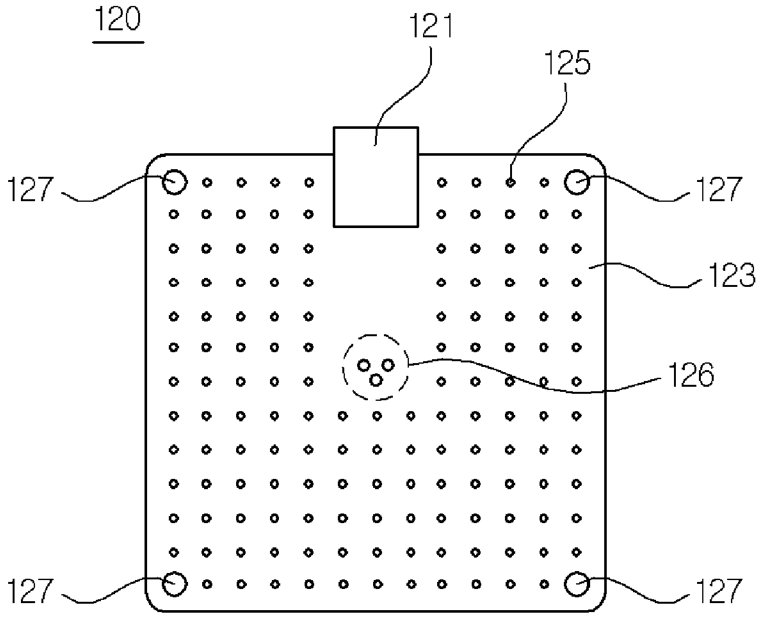
FIG. 3 is a view illustrating the top of a laser diode mounting substrate according to an exemplary embodiment of the present invention.
Figure 4:
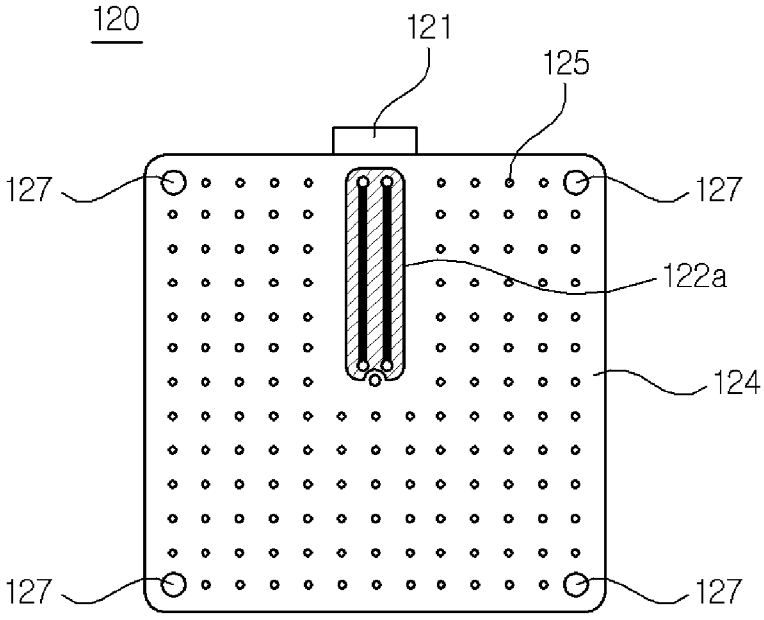
FIG. 4 is a view illustrating the bottom of the laser diode mounting substrate of FIG. 3.
Figure 5:
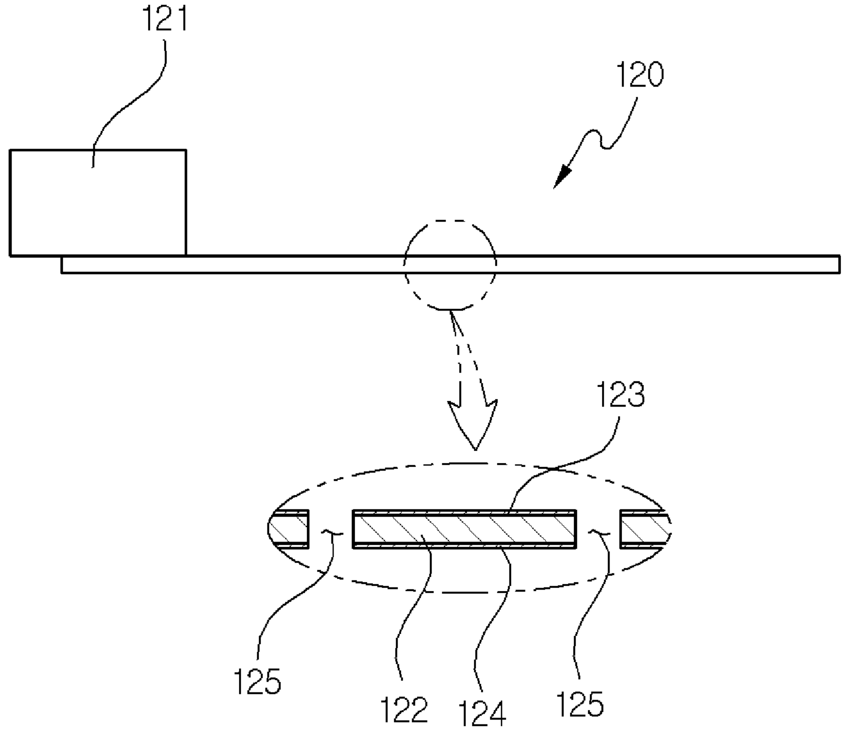
FIG. 5 is an enlarged view illustrating a cross-section of the laser diode mounting substrate of FIG. 3.

FIG. 3 is a view illustrating the top of a laser diode mounting substrate according to an embodiment of the present invention, FIG. 4 is a view illustrating the bottom of the laser diode mounting substrate of FIG. 3, and FIG. 5 is an enlarged view illustrating a cross-section of the laser diode mounting substrate of FIG. 3.

Referring to FIGS. 3 to 5, the laser diode mounting substrate 120 may include a substrate body 122, a first heat conduction layer 123 disposed on the top of the substrate body 122, and a second heat conduction layer 124 disposed on the bottom of the substrate body 122. A seat 126 where the laser diode 110 is mounted may be disposed at the center of the laser diode mounting substrate 120.

A power supply circuit pattern 122*a* is disposed on the bottom of the substrate body 122. The power supply circuit pattern 122*a* electrically connects a connector 121 with the contact point of the laser diode 110 on the seat 126. The connector 121 may be positioned at the center portion of any one of the longitudinal and transverse sides of the substrate body 122. Accordingly, the power supply circuit pattern 122*a* may be elongated from the center of the substrate body 122 to the center portion of any one of the longitudinal and transverse sides of the substrate body 122.

The first heat conduction layer 123 may be formed by plating the entire top of the substrate body 122 with copper. The second heat conduction layer 124 may be formed by plating the other region except for the power supply circuit pattern 122*a* of the bottom of the substrate body 122 with copper. The first heat conduction layer 123 and the second heat conduction layer 124 effectively transmit heat generated by the laser diode 110 to the upper heat sink 140 or the lower heat sink 130 in order to dissipate the heat.

In particular, heat transfer holes 125 may be disposed through the laser diode mounting substrate 120, the first heat conduction layer 123, and the second heat conduction layer 124 and increases the effect of heat dissipation by allowing heat to transfer from the upper heat sink 140 to the lower heat sink 130 or from the lower heat sink 130 to the upper heat sink 140.

A plurality of heat transfer holes 125 may be arranged longitudinally and transversely.

The laser diode mounting substrate 120, unlike the existing substrates for the laser diode 110, connects the upper heat sink 140 with the lower heat sink 130 so that they can transmit heat, in addition to fixing the laser diode 110 and supplying power.

On the other hand, fastening holes 127 for coupling the upper heat sink 140 and the lower heat sink 130 may be disposed at the corners of the laser diode mounting substrate 120. It is possible to fasten the laser diode mounting substrate 120, the lower heat sink 130, and the upper heat sink 140 by inserting fasteners such as bolts into the fastening holes 127.

The lower heat sink 130 is fastened to the bottom of the laser diode mounting substrate 120 and dissipates heat generated by the laser diode 110 to the outside.

Figure 6:
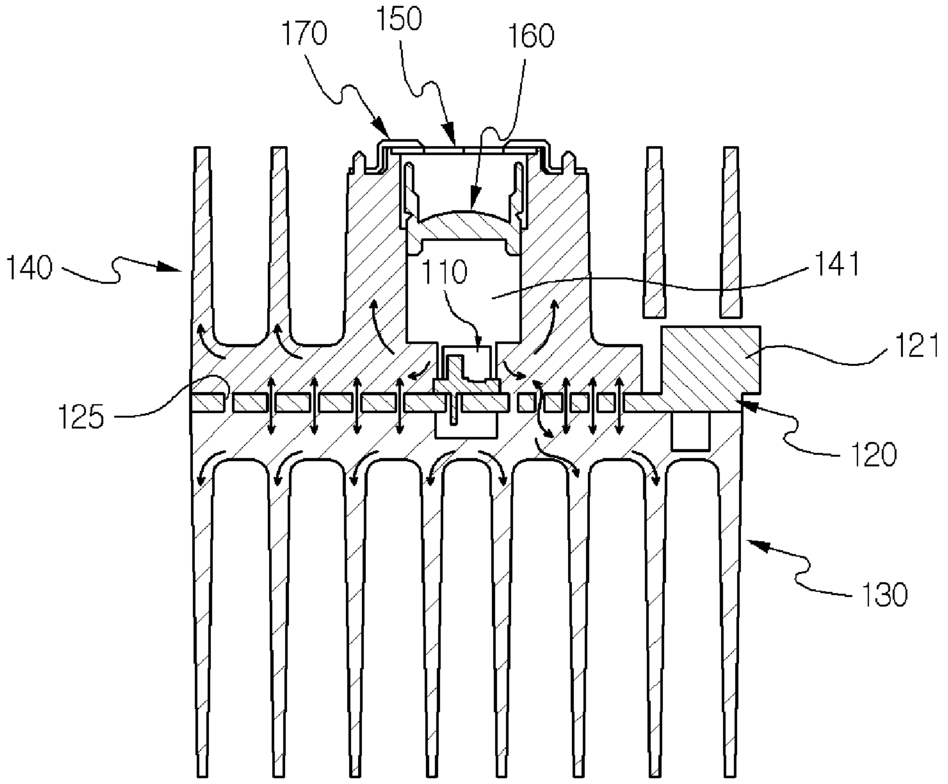
FIG. 6 is a cross-sectional view taken along line A-A' of FIG. 1.

FIG. 6 is a cross-sectional view taken along line A-A' of FIG. 1.

Referring to FIGS. 2 and 6, the upper heat sink 140 is fastened to the top of the laser diode mounting substrate 120 and dissipates heat generated by the laser diode 110 to the outside. A light channel 141 in which the laser diode 110 is inserted is disposed through the upper heat sink 140. The light channel 141, which is disposed through the center of the bottom and the center of the top of the upper heat sink 140, fixes the laser diode 110 and provides a space allowing the light emitted from the laser diode 110 to travel out of the upper heat sink 140.

The lower portion of the light channel 141 may function as a holder that fixes the laser diode 110. Accordingly, the lower portion of the light channel 141 may be appropriately disposed to fit to the size of the laser diode 110 and a specific structure for coupling may be disposed.

A connector seat 142, a recess where the connector 121 is inserted and received, may be disposed on the bottom of the upper heat sink 140 which is brought in contact with the laser diode mounting substrate 120.

The phosphor 150 is positioned ahead of the laser diode 110 in the light channel 141. The phosphor 140 can convert the light emitted from the laser diode 110 into white light.

Meanwhile, the collimator 160 may be positioned between the laser diode 110 and the phosphor 150 in the light channel 141.

The phosphor holder 170 can fix the phosphor 150 to the top of the upper heat sink 140. In an embodiment, the phosphor holder 170, as illustrated in FIG. 2, may have a slit portion 171 covering the light channel 141 and coupling portions 172 extended from the slit portion 171. A slit is cut in the slit portion 171. The slit of the slit portion 171 may be designed in the size making the optical efficiency the highest when white light is made by reaction of the light from the laser diode 110 with the phosphor 150. The slit of the slit portion 171 may be formed in a rectangular shape for easy optical design, similar to the existing automotive light sources such as LEDs and bulbs.

As indicated by the arrows in FIG. 6, the heat generated by the laser diode 110 is dissipated to the outside through the upper heat sink 140 and the lower heat sink 130. In particular, heat can easily transfer between the heat sinks through the laser diode mounting substrate 120 with the first heat conduction layer 123 and the second heat conduction layer 124, and more heat can transfer between the upper heat sink 140 and the lower heat sink 130 through the heat transfer holes 125.

As described above, the embodiments have been described and illustrated in the drawings and the specification. The embodiments were chosen and described in order to explain certain principles of the invention and their practical application, to thereby enable others skilled in the art to make and utilize various embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A laser diode mounting substrate for an automotive lamp module using a laser diode, the substrate comprising:

a substrate body with a power supply circuit pattern, which electrically connects a connector with a contact point of the laser diode, on the top of the substrate body;

a first heat conduction layer disposed at an area except for the power supply circuit pattern, on the top of the substrate body; and a second heat conduction layer disposed on a bottom of the substrate body, wherein at least one heat transfer hole is disposed through the first heat conduction layer, the substrate body, and the second heat conduction layer.

2. The substrate of claim 1, wherein the contact point of the laser diode is disposed at a center of the substrate body and the connector is disposed at a center portion of any one of the longitudinal and transverse sides of the substrate body.

3. The substrate of claim 1, wherein the heat transfer holes are arranged at predetermined gaps in any one of the longitudinal and transverse directions.

4. The substrate of claim 1, wherein the first heat conduction layer and the second heat conduction layer are formed by plating the substrate with copper.

5. The substrate of claim 1, wherein at least one fastening hole through which fastening members are inserted to fasten other parts is disposed through the first heat conduction layer, the substrate body, and the second heat conduction layer.

* * * * *